(12) United States Patent
Eto

(10) Patent No.: US 11,385,548 B2
(45) Date of Patent: Jul. 12, 2022

(54) PROCESS LIQUID AND METHOD OF PROCESSING SUBSTRATE

(71) Applicant: TOKYO OHKA KOGYO CO., LTD., Kawasaki (JP)

(72) Inventor: Takahiro Eto, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 137 days.

(21) Appl. No.: 16/748,041

(22) Filed: Jan. 21, 2020

(65) Prior Publication Data

US 2020/0241424 A1 Jul. 30, 2020

Related U.S. Application Data

(60) Provisional application No. 62/796,585, filed on Jan. 25, 2019.

(51) Int. Cl.
*G03F 7/42* (2006.01)
*G03F 7/30* (2006.01)
*G03F 7/20* (2006.01)

(52) U.S. Cl.
CPC .............. *G03F 7/425* (2013.01); *G03F 7/20* (2013.01); *G03F 7/30* (2013.01)

(58) Field of Classification Search
CPC .................................. G03F 7/425; G03F 7/30
See application file for complete search history.

(56) References Cited

U.S. PATENT DOCUMENTS

2003/0100459 A1 5/2003 Yoon et al.
2004/0256358 A1* 12/2004 Shimizu ............ H01L 21/02052
216/83
2012/0172274 A1 7/2012 Mizuta et al.

FOREIGN PATENT DOCUMENTS

JP A 2003-532143 10/2003
WO WO 2011/027773 A1 3/2011

* cited by examiner

*Primary Examiner* — John S Chu
(74) *Attorney, Agent, or Firm* — Knobbe Martens Olson & Bear LLP

(57) ABSTRACT

A resist stripping process liquid including a basic compound containing a nitrogen atom, an organic solvent, and water, the organic solvent including a cyclic amide compound, and the cyclic amide compound including 0.5% by mass or more of a compound represented by the following formula (1), based on the total amount of the process liquid. In formula (1), n represents an integer of 1 to 5, and R represents a C2-C10 organic group.

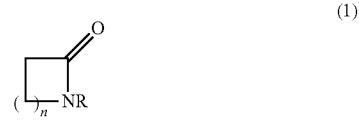

(1)

12 Claims, No Drawings

PROCESS LIQUID AND METHOD OF PROCESSING SUBSTRATE

Priority is claimed on U.S. Provisional Application No. 62/796,585, filed Jan. 25, 2019, the content of which is incorporated herein by reference.

TECHNICAL FIELD

The present invention relates to a process liquid preferably used for removing resist in the production of a semiconductor element such as IC or LSI or a liquid crystal panel display element, or in a wiring process; and a method of processing a substrate using the process liquid.

DESCRIPTION OF RELATED ART

In manufacturing semiconductor elements such as ICs and LSIs and liquid crystal panel elements, first, an insulating film such as a conductive metal film or an $SiO_2$ film is formed on a substrate such as a silicon wafer or glass by CVD. Next, a photoresist is uniformly applied on the conductive metal film or the insulating film, and is selectively exposed and developed to form a photoresist pattern. Then, using the pattern as a mask, the conductive metal film and the insulating film are selectively etched to form a fine circuit, and then unnecessary photoresist layers are removed with a stripping solution to manufacture the semiconductor device.

Conventionally, N-methylpyrrolidone (NMP) is widely used as an organic solvent for such a stripping solution due to i) higher availability and ii) higher polarity and easier dissolution of the resin component constituting the resist (for example, Example 5 of Patent Literature 1 and Example 1 of Patent Literature 2).

DOCUMENTS OF RELATED ART

Patent Literature

[Patent Literature 1] WO2011/027773
[Patent Literature 2] Japanese Unexamined Patent Application Publication (Translation of PCT Application) No. 2003-532143

SUMMARY OF THE INVENTION

However, in recent years, the load on the environment of NMP has been pointed out, and from the viewpoint of reducing such load, a situation has emerged in which a large amount of NMP cannot be blended in the process liquid.

In order to solve such a problem, for example, it is conceivable to replace NMP with a solvent described as an example in Patent Literatures 1 and 2. However, such solvent does not necessarily have the same properties as those of NMP, and the resist removability may be unsatisfactory. In such a case, it may be necessary to change the process conditions more than necessary in the manufacturing process of the semiconductor element or the like, and this may cause difficulty in process control.

The present invention takes the above circumstances into consideration, with an object of providing a process liquid that can reduce the load on the environment and that has a resist pattern removability equal to or greater than that of a conventional process liquid.

In order to solve the above-mentioned problems, the present inventors have made intensive studies focusing on components contained in a processing solution for stripping resist. As a result, the present inventors have found that the above problem can be solved by including a specific organic solvent while adding water to the process liquid. The present invention has been completed based on these findings. More specifically, the present invention provides the following.

The present invention provides a resist stripping process liquid including (A) a basic compound containing a nitrogen atom in a molecule thereof, (B) an organic solvent, and (W) water, the organic solvent (B) including a cyclic amide compound (B1), and the cyclic amide compound (B1) including 0.5% by mass or more of a compound represented by the following formula (1), based on the total amount of the process liquid.

[Chemical Formula 1]

In formula (1), n represents an integer of 1 to 5, and R represents a C2-C10 organic group.

The present invention also provides a method of processing a substrate, including: applying a photosensitive resin composition to a substrate to form a photosensitive resin composition film on the substrate; exposing the photosensitive resin composition film; developing the exposed photosensitive resin composition film to form a resist pattern; and removing the formed pattern with the aforementioned process liquid.

According to the present invention, there are provided a process liquid that can reduce the load on the environment and that has a resist pattern removability equal to or greater than that of a conventional process liquid.

Further, the present invention may achieve the following effects.

That is, as a substrate to be processed, aluminum (Al); an aluminum alloy (Al) such as an aluminum-silicon (Al—Si), aluminum-copper (Al—Cu), or aluminum-silicon-copper (Al—Si—Cu); titanium (Ti); a titanium alloy (Ti alloy) such as titanium nitride (TiN) or titanium tungsten (TiW); tantalum (Ta), tantalum nitride (TaN), tungsten (W); tungsten nitride (WN), copper (Cu), or the like may be used as a material of the conductive metal film. Such conductive metal film may be formed on the substrate in a single layer or a plurality of layers. Therefore, in such a case, the process liquid for removing resist may be required to be capable of suppressing corrosion of the metal film.

As a result of studies of the present inventors, when the process liquid of the present invention is applied to a substrate having such a metal film, corrosion of the metal film can be reduced more than in a conventional process.

Therefore, the process liquid of the present invention may be suitably used for processing a substrate provided with such a metal film.

DETAILED DESCRIPTION OF THE INVENTION

Hereinafter, embodiments of the present invention will be described in detail, but the present invention is by no way limited to the following embodiments, and can be implemented with appropriate modifications within the scope of the present invention.

[Process Liquid]

The process liquid of the present embodiment includes (A) a basic compound containing a nitrogen atom in a molecule thereof, (B) an organic solvent, and (W) water, the organic solvent (B) including a cyclic amide compound (B1), and the cyclic amide compound (B1) including 0.5% by mass or more of a compound represented by formula (1) described later, based on the total amount of the process liquid.

Hereinbelow, each of the components will be described.

<(A) Basic Compound Containing a Nitrogen Atom in a Molecule Thereof>

(A) a basic compound containing a nitrogen atom in a molecule thereof (hereafter, sometimes referred to as "component (A)") is not particularly limited, and examples thereof include a quaternary ammonium hydroxide, and a hydroxylamine derivative.

As the quaternary ammonium hydroxide for the component (A), a compound represented by the following formula (2) is preferable.

[Chemical Formula 2]

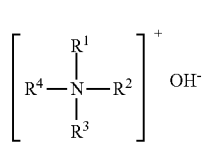

(2)

In the formula, $R^1$, $R^2$, $R^3$ and $R^4$ each independently represents a C1-C6 alkyl group or C1-C6 hydroxyalkyl group.

Specific examples of the quaternary ammonium hydroxide for the component (A) include tetramethylammonium hydroxide (TMAH), tetraethylammonium hydroxide, tetrapropylammonium hydroxide, tetrabutylammonium hydroxide, tetrapentylammonium hydroxide, monomethyltripropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, and (1-hydroxypropyl)trimethylammonium hydroxide. Among the above examples, in terms of availability and safety, TMAH, tetraethylammonium hydroxide, tetrapropylammonium hydroxide, tetrabutylammonium hydroxide, monomethyltripropylammonium hydroxide, and (2-hydroxyethyl)trimethylammonium hydroxide is preferable, and TMAH is more preferable. As the quaternary ammonium hydroxide, 1 kind of compound may be used, or 2 or more kinds of compounds may be used.

As the hydroxylamine derivative for the component (A), a compound represented by the following formula (3) is preferable.

[Chemical Formula 3]

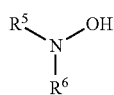

(3)

In the formula, $R^5$ represents a linear, branched or cyclic C1-C6 alkyl group or a linear or branched substituted C1-C4 alkyl group having 1 to 3 hydroxyl groups; and $R^6$ represents a hydrogen atom, a linear, branched or cyclic C1-C6 alkyl group or a linear or branched substituted C1-C4 alkyl group having 1 to 3 hydroxyl groups.

In formula (3), specific examples of the linear, branched or cyclic alkyl group having 1 to 6 carbon atoms represented by $R^5$ and $R^6$ include a methyl group, an ethyl group, an n-propyl group, an isopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, and a cyclohexyl group. Among these examples, an ethyl group, an n-propyl group and an n-butyl group is preferable, and an ethyl group is more preferable.

A specific example of the above-described hydroxylamine derivative includes a compound which is commonly used in this field, and specifically includes, for example, hydroxylamine and hydroxylamine derivative including C1-6 mono- or di(bis)alkylhydroxylamine such as, for example, mono- or dimethylhydroxylamine, mono- or diethylhydroxylamine, mono- or di-n-propylhydroxylamine, mono- or diisopropylhydroxylamine, mono- or di-n-butylhydroxylamine, mono- or diisobutylhydroxylamine, mono- or di-sec-butylhydroxylamine, mono- or di-tert-butylhydroxylamine, mono- or dicyclobutylhydroxylamine, mono- or di-n-pentylhydroxylamine, mono- or diisopentylhydroxylamine, mono- or di-sec-pentylhydroxylamine, mono- or di-tert-pentylhydroxylamine, mono- or dineopentylhydroxylamine, mono- or di-2-methylbutylhydroxylamine, mono- or bis(1,2-dimethylpropyl)hydroxylamine, mono- or di-1-ethylpropylhydroxylamine, mono- or dicyclopentylhydroxylamine, mono- or di-n-hexylhydroxylamine, mono- or diisohexylhydroxylamine, mono- or di-sec-hexylhydroxylamine, mono- or di-tert-hexylhydroxylamine, mono- or dineohexylhydroxylamine, mono- or di-2-methylpentylhydroxylamine, mono- or bis(1,2-dimethylbutyl)hydroxylamine, mono- or bis(2,3-dimethylbutyl)hydroxylamine, mono- or di-1-ethylbutylhydroxylamine, mono- or dicyclohexylhydroxylamine; C1-4 mono- or bis(hydroxyalkyl)hydroxylamine such as, for example, mono- or bis(1-hydroxyethyl)hydroxylamine, mono- or bis(2-hydroxyethyl)hydroxylamine, mono- or bis(1,2-dihydroxyethyl)hydroxylamine, mono- or bis(2,2-dihydroxyethyl)hydroxylamine, mono- or bis(1-hydroxy-n-propyl)-1-hydroxylamine, mono- or bis(2-hydroxy-n-propyl)-1-hydroxylamine, mono- or bis(3-hydroxy-n-propyl)-1-hydroxylamine, mono- or bis(1,2-dihydroxy-n-propyl)-1-hydroxylamine, mono- or bis(1,3-dihydroxy-n-propyl)-1-hydroxylamine, mono- or bis(2,2-dihydroxy-n-propyl)-1-hydroxylamine, mono- or bis(2,3-dihydroxy-n-propyl)-1-hydroxylamine, mono- or bis(3,3-dihydroxy-n-propyl)-1-hydroxylamine, mono- or bis(2,2,3-trihydroxy-n-propyl)-1-hydroxylamine, mono- or bis(2,3,3-trihydroxy-n-propyl)-1-hydroxylamine, mono- or bis(1-hydroxy-n-propyl)-2-hydroxylamine, mono- or bis(2-hydroxy-n-propyl)-2-hydroxylamine, mono- or bis(1,1-dihydroxy-n-propyl)-2-hydroxylamine, mono- or bis(1,2-dihydroxy-n-propyl)-2-hydroxylamine, mono- or bis(1,3-dihydroxy-n-propyl)-2-hydroxylamine, mono- or bis(1,2,3-trihydroxy-n-propyl)-2-hydroxylamine, mono- or bis(1-hydroxy-n-butyl)-1- hydroxylamine, mono- or bis(2-hydroxy-n-butyl)-1-hydroxylamine, mono- or bis(3-hydroxy-n-butyl)-1-hydroxylamine, mono- or bis(4-hydroxy-n-butyl)-1-hydroxylamine, mono- or bis(1,2-dihydroxy-n-butyl)-1-hydroxylamine, mono- or bis(1,3-dihydroxy-n-butyl)-1-hydroxylamine, mono- or bis(1,4-dihydroxy-n-butyl)-1-hydroxylamine, mono- or bis(2,2-dihydroxy-n-butyl)-1-hydroxylamine, mono- or bis(2,3-dihydroxy-n-butyl)-1-hydroxylamine, mono- or bis(2,4-dihydroxy-n-butyl)-1-hydroxylamine, mono- or bis(3,3-dihydroxy-n-butyl)-1-hydroxylamine, mono- or bis(3,4-dihydroxy-n-butyl)-1-hydroxylamine, mono- or bis(4,4-dihydroxy-n-butyl)-1-hydroxylamine, mono- or bis(1,2,3-trihydroxy-n-butyl)-1-hydroxylamine, mono- or bis(1,2,4-trihydroxy-n-butyl)-1-hydroxylamine, mono- or bis(1,3,4-trihydroxy-n-butyl)-1-hydroxylamine, mono- or bis(2,2,4-trihydroxy-n-butyl)-1-hydroxylamine, mono- or bis(2,3,3-trihydroxy-n-butyl)-1-hydroxylamine, mono- or bis(3,3,4-trihydroxy-n-butyl)-1-hydroxylamine, mono- or bis(2,4,4-trihydroxy-n-butyl)-1-hydroxylamine, mono- or bis(3.4.4-trihydroxy-n-butyl)-1-hydroxylamine, mono- or bis(2,3,4-trihydroxy-n-butyl)-1-hydroxylamine, mono- or bis(1-hydroxy-n-butyl)-2-hydroxylamine, mono- or bis(2-hydroxy-n-butyl)-2-hydroxylamine, mono- or bis(3-hydroxy-n-butyl)-2-hydroxylamine, mono- or bis(1-hydroxy-n-butyl)-3-hydroxylamine, mono- or bis(1,1-dihydroxy-n-butyl)-2-hydroxylamine, mono- or bis(1,2-dihydroxy-n-butyl)-2-hydroxylamine, mono- or bis(1,3-dihydroxy-n-butyl)-2-hydroxylamine, mono- or bis(1,4-dihydroxy-n-butyl)-2-hydroxylamine, mono- or bis(2,3-dihydroxy-n-butyl)-2-hydroxylamine, mono- or bis(2,4-dihydroxy-n-butyl)-2-hydroxylamine, mono- or bis(1,1-dihydroxy-n-butyl)-3-hydroxylamine, mono- or bis(1,2-dihydroxy-n-butyl)-3-hydroxylamine, mono- or bis(2,2-dihydroxy-n-butyl)-3-hydroxylamine, mono- or bis(1-hydroxy-2-methyl-n-propyl)-1-hydroxylamine, mono- or bis(2-hydroxy-2-methyl-n-propyl)-1-hydroxylamine, mono- or bis(3-hydroxy-2-methyl-n-propyl)-1-hydroxylamine, mono- or bis(1,2-dihydroxy-2-methyl-n-propyl)-1-hydroxylamine, mono- or bis(1,3-dihydroxy-2-methyl-n-propyl)-1-hydroxylamine, mono- or bis(3,3-dihydroxy-2-methyl-n-propyl)-1-hydroxylamine, mono- or bis(3-hydroxy-2-hydroxymethyl-n-propyl)-1-hydroxylamine, mono- or bis(1,2,3-trihydroxy-2-methyl-n-propyl)-1-hydroxylamine, mono- or bis(1,3,3-trihydroxy-2-methyl-n-propyl)-1-hydroxylamine, mono- or bis(2,3,3-trihydroxy-2-methyl-n-propyl)-1-hydroxylamine, mono- or bis(1,3-dihydroxy-2-hydroxymethyl-n-propyl)-1-hydroxylamine, mono- or bis(2,3-dihydroxy-2-hydroxymethyl-n-propyl)-1-hydroxylamine, mono- or bis(1-hydroxy-2-methyl-n-propyl)-2-hydroxylamine, mono- or bis(1,3-dihydroxy-2-methyl-n-propyl)-2-hydroxylamine, mono- or bis(1,3-dihydroxy-2-hydroxymethyl-n-propyl)-2-hydroxylamine; and C1-6 monoalkyl-mono(hydroxy-C1-4-alkyl) hydroxylamine such as, for example, ethylhydroxymethylhydroxylamine, ethyl-2-hydroxyethylhydroxylamine, ethyl-1,2-dihydroxyethylhydroxylamine; and the like.

In the process liquid of the present embodiment, as the component (A), one kind of compound may be used, or two or more kinds of compounds may be used in combination.

The amount of the component (A) based on the total amount of the process liquid is preferably 0.1 to 20% by mass, more preferably 0.3 to 15% by mass, still more preferably 0.5 to 10% by mass, and still more preferably 1 to 7% by mass. When the amount of the component (A) is within the above-mentioned range, it is possible to prevent corrosion of other materials such as metal wiring while maintaining good solubility of the resist film.

<(B) Organic Solvent>

(B) Organic solvent (hereafter, sometimes referred to as "component (B)") includes (B1) a cyclic amide compound (hereafter, sometimes referred to as "component (B1)").

The component (B1) contains 0.5% by mass or more of a compound represented by the following formula (1) (hereafter, sometimes referred to as "component (B1-1)"), based on the total amount of the process liquid.

[Chemical Formula 4]

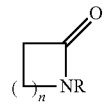

In formula (1), n represents an integer of 1 to 5, and R represents a C2-C10 organic group.

In formula (1), n is preferably an integer of 2 to 5, more preferably 2 or 3, and still more preferably 2.

In the formula (1), as the C2-C10 organic group, such as a C2-C10 monovalent hydrocarbon group.

Examples of the C2-C10 monovalent hydrocarbon group include a linear or branched C2-C10 alkyl group or a C3-C10 cyclic hydrocarbon group.

Specific examples of the linear C2-C10 alkyl group include an ethyl group, a propyl group, a butyl group, a pentyl group, a hexyl group, a heptyl group, an octyl group, a nonyl group, and a decyl group.

Specific examples of the branched C2-C10 alkyl group include a 1-methylethyl group, a 1,1-dimethylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Specific examples of the C3-C10 cyclic hydrocarbon group include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a tricyclodecyl group, a phenyl group, and a naphthyl group.

Among these examples, R is preferably a linear or branched C2-C10 alkyl group, more preferably a linear C2-C5 alkyl group, and still more preferably an ethyl group or a butyl group.

Among these examples, as the component (B1-1), N-ethylpyrrolidone or N-butylproldone is particularly desirable.

The component (B1) may contain a cyclic amide compound other than the component (B1-1) (hereafter, sometimes referred to as "component (B1-2)").

Examples of the component (B1-2) include N-methylpyrrolidone (NMP).

However, in the process liquid of the present embodiment, in terms of reducing the load on the environment, the amount of N-methylpyrrolidone based on the total amount of the process liquid is preferably less than 0.5% by mass, more preferably 0.3% by mass or less, and still more preferably 0% by mass.

In the process liquid of the present embodiment, as the component (B1), one kind of compound may be used, or two or more kinds of compounds may be used in combination.

The amount of the component (B1) based on the total amount of the process liquid is preferably 0.5 to 30% by mass, more preferably 1 to 20% by mass, and still more preferably 5 to 15% by mass. When the amount of the component (B1) is within the above-mentioned range, the resist removability may be further improved.

The component (B) may contain an organic solvent other than the component (B1) (hereafter, sometimes referred to as "component (B2)").

Examples of the component (B2) include protic polar solvents such as glycol solvents and monoalcohol solvents, and aprotic polar solvents such as ester solvents, amide solvents, sulfoxide solvents, sulfone solvents, and nitrile solvents.

Specific examples of the glycol solvent include methyldiglycol (MDG), ethyldiglycol (EDG), butyldiglycol (BDG), 3-methoxy-3-methyl-1-butanol (MMB), diisopropylene glycol monomethyl ether (DPM), ethylene glycol monobutyl ether (EGBE), propylene glycol monomethyl ether (PGME), ethylene glycol (EG), propylene glycol (PG), and glycerol.

Specific examples of the monoalcohol solvent include methanol, ethanol, n-propanol, isopropanol, n-butanol, and tert-butanol.

Specific examples of the ester solvent include ethyl acetate, n-propyl acetate, isobutyl acetate, Ethyl lactate, diethyl oxalate, diethyl tartrate, β-propiolactone, γ-butyrolactone, and ε-caprolactone.

Specific examples of the amide solvent include dimethylformamide, and dimethylacetamide.

Specific examples of the sulfoxide solvent include dimethyl sulfoxide.

Specific examples of the sulfone solvent include sulfolane.

Specific examples of the nitrile solvent include acetonitrile.

In the process liquid of the present embodiment, as the component (B2), one kind of compound may be used, or two or more kinds of compounds may be used in combination.

The amount of the component (B2) based on the total amount of the process liquid is preferably 20 to 98.5% by mass, more preferably 35 to 96% by mass, and still more preferably 45 to 90% by mass. When the amount of the component (B1) is within the above-mentioned range, the resist removability may be further improved.

Among these examples, as the component (B2), a glycol solvent is preferable, and two or more glycol solvents are more preferable, and at least two members selected from the group consisting of methyl diglycol (MDG), butyl diglycol (BDG) and propylene glycol (PG) are still more preferable.

In the case where methyl diglycol (MDG), butyl diglycol (BDG) and propylene glycol (PG) are used as the component (B2), the amount of each solvent based on the total amount of the process liquid is preferably 15 to 25% by mass of MDG, 35 to 45% by mass of BDG and 15 to 25% by mass of PG, more preferably 15 to 20% by mass of MDG, 40 to 45% by mass of BDG and 20 to 25% by mass of PG, and still more preferably 17 to 19% by mass of MDG, 41 to 43% by mass of BDG and 21 to 23% by mass of PG.

In the process liquid of the present embodiment, the amount of the component (B) based on the total amount of the process liquid is preferably 50 to 99% by mass, more preferably 55 to 97% by mass, and still more preferably 60 to 95% by mass. When the amount of the component (B1) is within the above-mentioned range, the resist removability may be further improved.

<(W) Water>

As (W) water (hereafter, sometimes referred to as "component (W)"), it is preferable to use pure water, deionized water, ion exchanged water, or the like.

The amount of the component (W) based on the total amount of the process liquid is preferably 0.5 to 50% by mass, more preferably 1 to 35% by mass, and still more preferably 1 to 10% by mass. When the amount of water is within the above-mentioned range, handleability may be improved.

The process liquid of the present embodiment may contain any other component such as a surfactant, as long as the effects of the present invention are not impaired. The surfactant is not particularly limited, and examples thereof include a nonionic surfactant, an anionic surfactant, a cationic surfactant, and an amphoteric surfactant.

The process liquid of the present embodiment includes a cyclic amide compound (B1) as the organic solvent (B), and the cyclic amide compound (B1) includes 0.5% by mass or more of a compound represented by the aforementioned formula (1) (component (B1-1)), based on the total amount of the process liquid.

The component (B1-1) has higher lipophilicity (hydrophobicity) than N-methylpyrrolidone (NMP), which has been widely used as an organic solvent in a stripping solution. Therefore, it is presumed that the processing liquid of the present embodiment readily dissolves the resin constituting the main component of the resist, and has a resist pattern removability equal to or higher than that of a conventional process liquid.

In addition, the polarity of the entire molecule of the component (B1-1) is suppressed as compared with NMP. Therefore, when the process liquid of the present embodiment is applied to a substrate having a metal film, it is presumed that corrosion of the metal film is suppressed when the resist is stripped.

Further, since the process liquid of the present embodiment employs the component (B1-1) instead of NMP, it is presumed that the load on the environment can be reduced.

[Method of Processing Substrate]

The method of processing a substrate according to the present embodiment includes: a step of applying a photosensitive resin composition to a substrate to form a photosensitive resin composition film on the substrate (hereafter, sometimes referred to as "step (I)"); exposing the photosensitive resin composition film (hereafter, sometimes referred to as "step (II)"); developing the exposed photosensitive resin composition film to form a resist pattern (hereafter, sometimes referred to as "step (III)"); and removing the formed pattern with the aforementioned process liquid (hereafter, sometimes referred to as "step (IV)").

<Step (I)>

Step (I) is not particularly limited. For example, the photosensitive resin composition is applied on a substrate by a spinner or the like, and a bake (post-apply bake (PAB)) treatment is performed at a temperature of, for example, 80 to 150° C. for 40 to 120 seconds, more preferably for 60 to 90 seconds, to form a photosensitive resin composition film.

The substrate is not particularly limited, and for example, a substrate such as a silicon substrate, a substrate coated with silicon dioxide, and the like used for manufacturing an integrated circuit element may be used.

On the substrate, a metal film made of a conductive material such as aluminum (Al); an aluminum alloy (Al) such as an aluminum-silicon (Al—Si), aluminum-copper (Al—Cu), or aluminum-silicon-copper (Al—Si—Cu); titanium (Ti); a titanium alloy (Ti alloy) such as titanium nitride (TiN) or titanium tungsten (TiW); tantalum (Ta), tantalum nitride (TaN), tungsten (W); tungsten nitride (WN); or copper (Cu) may be formed in a single layer or a plurality of layers.

The kind of the photosensitive resin composition is not particularly limited, and examples thereof include a resin composition containing a novolak resin, a styrene resin, an acrylic resin, or the like as a base component.

<Step (II)>

Step (II) is not particularly limited, and examples thereof include performing a selective exposure through a mask (mask pattern) on which a predetermined pattern is formed using an exposure apparatus capable of irradiating radial ray such as an ArF excimer laser, a KrF excimer laser, $F_2$ excimer laser, and EUV (extreme ultraviolet ray), VUV (vacuum ultraviolet ray), X-ray, or soft X-ray, or by drawing or the like by direct irradiation of electron beams.

Further, the photosensitive resin composition film after the exposure may be subjected to a bake (post-exposure bake (PEB)) treatment at a temperature condition of, for example, 80 to 150° C. for 40 to 120 seconds, preferably for 60 to 90 seconds.

The exposure method of the photosensitive resin composition film may be ordinary exposure (dry exposure) performed in an inert gas such as air or nitrogen, or liquid immersion exposure (liquid immersion lithography).

<Step (III)>

Step (III) is not particularly limited. For example, in the case of an alkali developing process, an alkali developing solution is used, and in the case of a solvent developing process, the process is performed using a developing solution containing an organic solvent (organic developing solution).

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrile solvents, amide solvents and ether solvents, and hydrocarbon solvents.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

After the development process, a rinse process or the like may be performed on the formed resist pattern.

<Step (IV)>

Although step (IV) is not particularly limited, step (IV) may be performed in a single wafer type or a batch type using the treatment liquid of the present embodiment. Single wafer processing is a method of processing wafers one by one. As one of the single-wafer-type embodiments, there is a method in which a process liquid is spread over the entire wafer surface by a spin coater to perform processing. The liquid temperature of the process liquid, the discharge amount of the process liquid, and the number of rotations of the substrate of the spin coater are selected and used depending on the selection of the target substrate.

In the present embodiment, the conditions for performing step (IV) are not particularly limited. For example, in a single-wafer stripping step, the substrate is transported or rotated in a predetermined direction, and the process liquid of the present embodiment is discharged into the space. The process liquid is brought into contact with the substrate by spraying, flowing, dropping, or the like. If desired, the process liquid may be sprayed while rotating the substrate using a spin coater. On the other hand, in batch-type stripping, the substrate is immersed in a liquid bath containing the process liquid of the present embodiment, and the substrate and the process liquid are brought into contact in the liquid bath. The stripping methods may be appropriately used depending on the structure and material of the element. The temperature at which the stripping is performed is not particularly limited, but is preferably 70° C. or lower, and more preferably 60° C. or lower.

In the case of single-wafer processing, the supply rate of the process liquid is not particularly limited. Although depending on the size of the substrate, the supply rate of the process liquid is preferably 0.3 to 3 L/min, more preferably 0.5 to 2 L/min. When the supply rate of the process liquid is at least as large as the lower limit of the above-mentioned range, critical dimension uniformity may be reliably secured. When the supply rate of the process liquid is no more than the upper limit of the above-mentioned range, stable performance during continuous processing may be secured, which is preferable. When the substrate is rotated, it is preferable to rotate the substrate at 100 to 1000 rpm from the same viewpoint as above, though it depends on the size and the like. The "temperature" here is the temperature of the surface of the processing substrate in the case of single-wafer processing, and the temperature of the process liquid in the batch in the case of batch processing.

EXAMPLES

Hereinafter, examples of the present invention will be described. However, these examples are merely examples for suitably describing the present invention, and do not limit the present invention in any way.

[Preparation of Process Liquid]

Each component was mixed at a composition ratio shown in Table 1 to obtain a process liquid. The abbreviations in the table represent the following compounds.

TMAH: Tetramethylammonium hydroxide
NEP: N-ethylpyrrolidone
NBP: N-butylpyrrolidone
NMP: N-methylpyrrolidone
MDG: Methyl diglycol
BDG: Butyl diglycol
PG: Propylene glycol

[Removability of Photoresist Film]

TFR-H (manufactured by Tokyo Ohka Kogyo Co., Ltd.) as a photoresist for TFT was patterned on the wafer, and post-baked at 150° C. for 90 seconds. The wafer having the resist pattern was immersed in a process liquid shown in the following Table 1 heated to 50° C. for 2 minutes, and the resist removability was observed with an SEM photograph and evaluated according to the following evaluation criteria. The results are shown in Table 1.

(Criteria)

A: Completely removed.

B: Although a portion of residue was observed, practically no problem.

C: A large portion of residue was observed.

[Corrosion of Metal (Immersion Method)]

The wafer on which copper was formed was immersed in a treatment solution shown in Table 1 below at 50° C. for 30 minutes, and the sheet resistance was measured. From the results, the etching amount (corrosion amount) of copper was determined, and the corrosiveness of copper was evaluated according to the following evaluation criteria. The results are shown in Table 1. The sheet resistance was measured using VR-250 (manufactured by Kokusai Electric Inc.).

(Criteria)

A: No practically problematic corrosion was observed.
B: Partial corrosion was observed.
C: Serious corrosion was occurring.

TABLE 1

|  | Example 1 | Example 2 | Reference Example |
|---|---|---|---|
| TMAH | 5 | 5 | 5 |
| NEP | 10 |  |  |
| NBP |  | 10 |  |
| NMP |  |  | 10 |
| MDG | 18 | 18 | 18 |
| BDG | 42 | 42 | 42 |
| PG | 22 | 22 | 22 |
| Water | 3 | 3 | 3 |
| Removability of photoresist film | A | A | B |
| Corrosion of metal | A | A | B |

* Compositional ratio is indicated in mass %.

From the results shown in Table 1, it was confirmed that the process liquids of Examples 1 and 2 had resist removability equal to or higher than those of the conventional process liquids using NMP. Furthermore, it can be said that the process liquids of Examples 1 and 2 hardly cause metal corrosion and can be suitably used for the substrate processing process.

What is claimed is:

1. A resist stripping process liquid comprising:
(A) a basic compound represented by the following formula (2);
(B1) a cyclic amide compound represented by the following formula (1),
(B2) at least one glycol solvent selected from the group consisting of methyldiglycol, ethyldiglycol, butyldiglycol, 3-methoxy-3-methyl-1-butanol, diisopropylene glycol monomethyl ether, ethylene glycol monobutyl ether, propylene glycol monomethyl ether, ethylene glycol, propylene glycol and glycerol, and
(W) water,
wherein the amount of the basic compound (A) based on the total amount of the basic compound (A), the cyclic amide compound (B1), the at least one glycol solvent (B2) and the water (W) is 0.1 to 20% by mass,
the amount of the cyclic amide compound (B1) based on the total amount of the basic compound (A), the cyclic amide compound (B1), the at least one glycol solvent (B2) and the water (W) is 0.5 to 15% by mass,
the amount of the at least one glycol solvent (B2) based on the total amount of the basic compound (A), the cyclic amide compound (B1), the at least one glycol solvent (B2) and the water (W) is 45 to 98.5% by mass, and
the amount of the water (W) based on the total amount of the basic compound (A), the cyclic amide compound (B1), the at least one glycol solvent (B2) and the water (W) is 0.5 to 50% by mass:

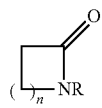

(1)

wherein n represents an integer of 1 to 5, and R represents a C2-C10 organic group; and

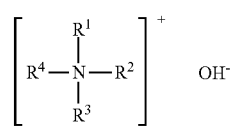

(2)

wherein $R^1$, $R^2$, $R^3$ and $R^4$ each independently represents a C1-C6 alkyl group or C1-C6 hydroxyalkyl group.

2. The resist stripping process liquid according to claim 1, wherein the basic compound (A) comprises tetramethylammonium hydroxide.

3. The resist stripping process liquid according to claim 1, wherein the at least one glycol solvent (B2) comprises 2 or more types of glycol solvents.

4. The resist stripping process liquid according to claim 1, wherein an amount of N-methylpyrrolidone based on the total amount of the process liquid is less than 0.5% by mass.

5. The resist stripping process liquid according to claim 2, wherein an amount of N-methylpyrrolidone based on the total amount of the process liquid is less than 0.5% by mass.

6. The resist stripping process liquid according to claim 3, wherein an amount of N-methylpyrrolidone based on the total amount of the process liquid is less than 0.5% by mass.

7. The resist stripping process liquid according to claim 1, which contains no N-methylpyrrolidone.

8. The resist stripping process liquid according to claim 2, which contains no N-methylpyrrolidone.

9. The resist stripping process liquid according to claim 3, which contains no N-methylpyrrolidone.

10. A method of processing a substrate, comprising:
applying a photosensitive resin composition to a substrate to form a photosensitive resin composition film on the substrate;
exposing the photosensitive resin composition film;
developing the exposed photosensitive resin composition film to form a resist pattern; and
removing the formed pattern using the process liquid of claim 1.

11. The method according to claim 10, wherein the substrate has a metal layer formed on a surface thereof.

12. A resist stripping process liquid consisting of:
(A) a basic compound represented by the following formula (2),
(B1) a cyclic amide compound represented by the following formula (1),
(B2) at least one glycol solvent selected from the group consisting of methyldiglycol, ethyldiglycol, butyldiglycol, 3-methoxy-3-methyl-1-butanol, diisopropylene glycol monomethyl ether, ethylene glycol monobutyl ether, propylene glycol monomethyl ether, ethylene glycol, propylene glycol and glycerol, and
(W) water:

(1)
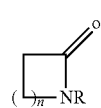
wherein n represents an integer of 1 to 5, and R represents a C2-C10 organic group; and
(2)
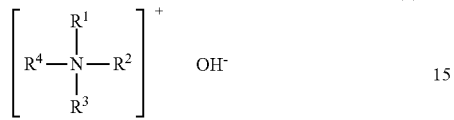
wherein $R^1$, $R^2$, $R^3$ and $R^4$ each independently represents a C1-C6 alkyl group or C1-C6 hydroxyalkyl group.
* * * * *